United States Patent
Henshaw et al.

(10) Patent No.: US 8,659,355 B2
(45) Date of Patent: Feb. 25, 2014

(54) POWER SUPPLY ARRANGEMENT FOR MULTI-STAGE AMPLIFIER

(75) Inventors: Robert Henshaw, Cambourne (GB); Gerard Wimpenny, Cambourne (GB)

(73) Assignee: Nujira Limited, Cambridge (GB)

( * ) Notice: Subject to any disclaimer, the term of this patent is extended or adjusted under 35 U.S.C. 154(b) by 26 days.

(21) Appl. No.: 13/129,718

(22) PCT Filed: Nov. 4, 2009

(86) PCT No.: PCT/EP2009/064597
§ 371 (c)(1),
(2), (4) Date: Dec. 7, 2011

(87) PCT Pub. No.: WO2010/057773
PCT Pub. Date: May 27, 2010

(65) Prior Publication Data
US 2012/0068767 A1 Mar. 22, 2012

(30) Foreign Application Priority Data
Nov. 18, 2008 (GB) .................................. 0821077.5

(51) Int. Cl.
*H03G 3/20* (2006.01)
(52) U.S. Cl.
USPC .......................................... 330/127; 330/136
(58) Field of Classification Search
USPC .......................................... 330/127, 136, 297
See application file for complete search history.

(56) References Cited

U.S. PATENT DOCUMENTS

| | | |
|---|---|---|
| 6,529,716 B1 | 3/2003 | Eidson et al. |
| 6,734,724 B1 | 5/2004 | Schell et al. |
| 7,035,604 B2 | 4/2006 | Sander et al. |
| 7,158,494 B2 | 1/2007 | Sander et al. |
| 7,259,632 B1 | 8/2007 | LeBoeuf, II |
| 8,183,917 B2 * | 5/2012 | Drogi et al. ..................... 330/129 |
| 2003/0160658 A1 | 8/2003 | Cioffi et al. |
| 2005/0008093 A1 | 1/2005 | Matsuura et al. |
| 2005/0151586 A1 | 7/2005 | Grillo et al. |
| 2007/0014382 A1 | 1/2007 | Shakeshaft et al. |
| 2007/0182490 A1 | 8/2007 | Hau et al. |
| 2011/0090007 A1 * | 4/2011 | Wimpenny .................... 330/127 |

FOREIGN PATENT DOCUMENTS

EP 0 413 355 A2 2/1991

OTHER PUBLICATIONS

"PCT International Preliminary Report on Patentability for International Application No. PCT/EP2009/064597", Jun. 30, 2011, Publisher: International Searching Authority, Published in: DE.
British Patent Office, "British Office Action for British International Application No. GB 08210775", Dated: Feb. 17, 2009, Publisher: British Intellectual Property Office, Published in: GB.
Officer: Thomas Agerbaek, "International Search Report and Written Opinion for International Application No. PCT/EP2009/064597", Dated: Mar. 29, 2010, Publisher: EPO, Published in: EP.

* cited by examiner

*Primary Examiner* — Steven J Mottola
(74) *Attorney, Agent, or Firm* — Kaplan, Breyer, Schwarz & Ottesen, LLP

(57) ABSTRACT

There is disclosed a multi-stage amplifier comprising: a first amplifier stage; a second amplifier stage; a first voltage supply stage arranged to provide a supply voltage to the first amplifier in dependence on an average power of a signal to be amplified; and a second voltage supply stage arranged to provide a supply voltage to the second amplifier in dependence on an instantaneous power of a signal to be amplified.

15 Claims, 8 Drawing Sheets

POWER SUPPLY ARRANGEMENT FOR MULTI-STAGE AMPLIFIER

BACKGROUND TO THE INVENTION

1. Field of the Invention

The present invention relates to power supply arrangements for multi-stage amplifiers. The invention is particularly but not exclusively concerned with power supply arrangements for multi-stage amplifiers which utilise envelope tracking techniques.

2. Description of the Related Art

In a multi-stage amplifier arrangement, a plurality of amplifier stages are provided in series for amplification of a signal. An example multi-stage amplifier arrangement for amplification of a radio frequency (RF) signal may comprise a driver amplifier stage followed by a power amplifier stage. Such a two-stage amplifier arrangement is typically provided in a transmitter in a handset or mobile device of a mobile communications system.

In order to achieve efficiency in the operation of power amplifier arrangements, various schemes have been disclosed in the prior art for efficiently providing a supply voltage to an amplifier stage, and particularly to a power amplifier stage. A particularly advantageous high efficiency amplification scheme is disclosed in European Patent No. 1597821 in the name of Nujira Limited.

In multi-stage amplifier arrangements, it is known in the prior art to apply a modulated supply voltage simultaneously to two or more amplification stages. Such an approach is successful for the amplification of narrowband signals, such as GSM/EDGE 200 kHz bandwidth signals.

However the envelope tracking principles of a high efficiency tracking supply place tight limits on time alignment between the various signal paths in the system. For narrowband signals, these limitations can be handled. However for wideband signals, such as in wideband code division multiple access (WCDMA) systems, world interoperability for microwave access (WiMAX) systems, or long term evolution (LTE) systems for example, these requirements create difficulties in providing supply modulation on more than one amplifier stage at any given time.

In the prior art, therefore, for a multi-stage amplifier arrangement where a highly efficient modulated power supply stage is provided using envelope tracking, typically such supply modulation is provided for only one amplifier stage. The one or more remaining amplifier stages are arranged to operate from fixed supply voltages. The operation of the one or more remaining amplifier stages based on fixed supply voltages results in poor operating efficiency. This poor efficiency is particularly relevant for systems where the RF output can vary over a large dynamic range, and/or the RF signal has a high peak-to-average power ratio (PAPR).

It is an object of the invention to provide a multi-stage amplifier arrangement in which efficiency of performance is improved.

SUMMARY OF THE INVENTION

In one aspect the invention provides a multi-stage amplifier comprising: a first amplifier stage; a second amplifier stage; a first voltage supply stage arranged to provide a supply voltage to the first amplifier in dependence on an average power of a signal to be amplified; and a second voltage supply stage arranged to provide a supply voltage to the second amplifier in dependence on an instantaneous power of a signal to be amplified.

The first voltage supply stage may comprise a switched supply stage. The switched supply stage may select one of a plurality of supply voltages generated in the second voltage supply stage. The switched supply stage may select one of a plurality of supply voltages generated in the first voltage supply stage. The multi-stage amplifier may further comprise means for determining the instantaneous power and the average power, wherein the average power is determined over a predetermined time interval.

There may be provided a means for determining the average of the supply generated by the second supply voltage stage, and providing the first supply voltage in dependence upon the determined average. The means for determining the average of the supply generated by the second supply voltage stage may comprise a low pass filter. The first voltage supply stage may further comprise a switched supply stage, wherein the switched supply is controlled by the determined average. The multi-stage amplifier may further comprise a sample-and-hold stage for sampling the determined average.

The first and second voltage supply stages may be arranged to selectively provide supply voltages to the first and second amplifier stages, wherein in a first mode of operation a signal is amplified by the first and second amplifier stages, and the first supply voltage stage is selected to provide a supply voltage to the first amplifier stage and the second supply voltage stage is selected to provide a supply voltage to the second amplifier stage, and in a second mode of operation the second amplifier is bypassed, the signal being amplified by the first amplifier stage, and the second supply voltage stage being selected to provide a supply voltage to the first amplifier stage.

In one aspect the invention provides a multi-stage amplifier comprising: a first amplifier stage; a second amplifier stage; a first tracking power supply stage for providing a tracking supply voltage to the first amplifier; and a second tracking power supply stage, for providing a tracking supply voltage to the second amplifier, wherein the second tracking power supply voltage tracks faster than the first.

In one aspect the invention provides a method of amplifying a signal in an amplification stage comprising a first amplifier stage; a second amplifier stage; a first voltage supply stage; and a second voltage supply stage, the method comprising: arranging the first voltage supply stage to provide a supply voltage to the first amplifier in dependence on an average power of a signal to be amplified; and arranging the second voltage supply stage to provide a supply voltage to the second amplifier in dependence on an instantaneous power of the signal to be amplified.

The first voltage supply stage may comprise a switched supply stage. The switched supply stage may select one of a plurality of supply voltages generated in the second voltage supply stage. The switched supply stage may select one of a plurality of supply voltages generated in the first voltage supply stage.

The method may further comprise determining the average of the supply generated by the second supply voltage stage, and providing the first supply voltage in dependence upon the determined average.

The step of determining the average of the supply generated by the second supply voltage stage may comprise low pass filtering.

The first voltage supply stage may further comprise a switched supply stage, wherein the method further comprises controlling the switched supply by the determined average.

The method may further comprise a sampling the determined average.

The first and second voltage supply stages may selectively provide supply voltages to the first and second amplifier stages, wherein in a first mode of operation a signal is amplified by the first and second amplifier stages, and the first supply voltage stage is selected to provide a supply voltage to the first amplifier stage and the second supply voltage stage is selected to provide a supply voltage to the second amplifier stage, and in a second mode of operation the second amplifier is bypassed, the signal being amplified by the first amplifier stage, and the second supply voltage stage being selected to provide a supply voltage to the first amplifier stage.

In one aspect the invention provides a method of amplifying a signal in an amplification stage comprising a first amplifier stage; a second amplifier stage; a first voltage supply stage; and a second voltage supply stage, the method comprising: arranging the first voltage supply stage to provide a tracking supply voltage to the first amplifier; and arranging the second voltage supply stage to provide a tracking supply voltage to the first amplifier, wherein the second voltage supply stage tracks faster than the first.

In one aspect the invention provides a multi-stage amplifier including a first amplifier stage, a second amplifier stage, and a tracking voltage supply stage arranged to provide a supply voltage in dependence on an instantaneous power requirement, wherein in a first mode of operation a signal is amplified by the first and second amplifier stages, and the supply voltage to the second amplifier stage is provided by the tracking voltage supply, and in a second mode of operation the second amplifier stage is bypassed, the signal being amplified by the first amplifier stage, and the supply voltage to the first amplifier stage is provided by the tracking voltage supply.

The multi-stage amplifier according may further comprise a further voltage supply stage arranged to provide a supply voltage in dependence on an average power requirement, wherein in the first mode of operation the further voltage supply stage provides a supply voltage for the first amplifier stage.

The first voltage supply stage may comprise a switched supply stage.

The switched supply stage may select one of a plurality of supply voltages generated in the second voltage supply stage. The switched supply stage may select one of a plurality of supply voltages generated in the first voltage supply stage.

There may be provided a means for determining the average of the supply generated by the second supply voltage stage, and providing the first supply voltage in dependence upon the determined average.

The means for determining the average of the supply generated by the second supply voltage stage may comprise a low pass filter.

The first voltage supply stage may further comprises a switched supply stage, wherein the switched supply is controlled by the determined average.

The multi-stage amplifier may further comprise a sample-and-hold stage for sampling the determined average.

The first voltage supply stage may generate the supply voltage in dependence on an average power requirement of the signal to be amplified by the first amplifier; and the second voltage supply stage generates the supply voltage in dependence on an instantaneous power requirement of the signal to be amplified by the second amplifier.

In one aspect the invention provides a multi-stage amplifier including a first amplifier stage, and a tracking voltage supply stage which fast-tracks a signal to be amplified, wherein in a first mode of operation a signal is amplified by the first and second amplifier stages, and the supply voltage to the second amplifier stage is provided by the tracking voltage supply, and in a second mode of operation the second amplifier stage is bypassed, the signal being amplified by the first amplifier stage, and the supply voltage to the first amplifier stage is provided by the tracking voltage supply.

The multi-stage amplifier may further comprise a further tracking voltage supply stage which slow-tracks the signal to be amplified, wherein in the first mode of operation the further voltage supply stage provides a supply voltage for the first amplifier stage.

In one aspect the invention provides a method of amplifying a signal in a multi-stage amplifier including a first amplifier stage, a second amplifier stage, and a tracking voltage supply stage arranged to track in dependence on an instantaneous power, the method comprising: in a first mode of operation a signal is controlled to be amplified by the first and second amplifier stages, and the supply voltage to the second amplifier stage is provided by the tracking voltage supply, and in a second mode of operation the second amplifier stage is bypassed, the signal being amplified by the first amplifier stage, and the supply voltage to the first amplifier stage is provided by the tracking voltage supply.

The method may further comprise providing a further voltage supply stage arranged to track in dependence on an average power, wherein in the first mode of operation the further voltage supply stage provides a supply voltage for the first amplifier stage.

In one aspect the invention provides a method of amplifying a signal in a multi-stage amplifier including a first amplifier stage, a second amplifier stage, and a tracking voltage supply stage adapted to fast-track a signal to be amplified, the method comprising: in a first mode of operation a signal is controlled to be amplified by the first and second amplifier stages, and the supply voltage to the second amplifier stage is provided by the tracking voltage supply, and in a second mode of operation the second amplifier stage is bypassed, the signal being amplified by the first amplifier stage, and the supply voltage to the first amplifier stage is provided by the tracking voltage supply.

The method may further comprise a further tracking voltage supply stage adapted to slow-track the signal to be amplified, wherein in the first mode of operation the further voltage supply stage provides a supply voltage for the first amplifier stage.

In one aspect the invention provides a multi-stage amplifier including a first amplifier, an average tracking voltage supply stage which tracks the average power of a signal to be amplified, and an instantaneous tracking voltage supply stage which tracks the instantaneous power of a signal to be amplified, wherein the power supply for the power amplifier is selectively provided by either the average tracking voltage supply or the instantaneous tracking voltage supply.

There may be provided a second amplifier arranged in series to receive at it's input the output of the first amplifier, wherein in a first mode of operation the power supply for the first amplifier may be provided by the average tracking voltage supply, and the power supply for the second amplifier is provided by the instantaneous tracking voltage supply, and in a second mode of operation the power supply for the first amplifier may be provided by the instantaneous tracking voltage supply and the second amplifier is bypassed.

In a third mode of operation the power supply for the first amplifier may be provided by the average tracking voltage supply and the second amplifier is bypassed.

The average tracking voltage supply may be provided by a switched supply stage, and the instantaneous tracking voltage supply is provided by an error correction stage in dependence on the average tracking voltage supply. The average tracking voltage may provided by a filtering means arranged to filter the instantaneous tracking voltage.

There may be provided a second amplifier arranged in parallel with the first amplifier, the first and second amplifiers having a common input and a common output, wherein in a first mode of operation the first amplifier is selected and the second amplifier is disabled, the power supply to the first amplify being provided by the average tracking voltage supply, and in the second mode of operation the second amplifier is selected and the first amplifier is disabled, the power supply to the second amplified being provided by the instantaneous tracking voltage supply.

There may be provided a third amplifier arranged to provide an input to the first and second amplifiers, wherein in the first or second mode of operation the power supply for the third amplifier is provided by the average tracking voltage supply, and in a third mode of operation the power supply for the third amplifier is provided by the instantaneous tracking voltage supply and the first and second amplifiers are bypassed.

The average tracking voltage supply may be provided by a switched supply stage, and the instantaneous tracking voltage supply is provided by an error correction stage in dependence on the average tracking voltage supply. The average tracking voltage may be provided by a filtering means arranged to filter the instantaneous tracking voltage.

There may be provided a second amplifier arranged in parallel with the first amplifier, the first and second amplifiers having a common input and a common output, wherein in a first mode of operation the first and second amplifiers are both enabled, the power supply to the first and second amplifiers being provided by the instantaneous tracking voltage supply.

In a second mode of operation one amplifier may be enabled and the other amplifier may be disabled, the power supply to the selected amplifier being provided by the instantaneous tracking voltage supply.

In a second mode of operation one amplifier may be enabled and the other amplifier may be disabled, the power supply to the selected amplifier being provided by the average tracking voltage supply.

The first and second amplifiers may comprise a Doherty configuration.

The average tracking voltage supply may be provided by a switched supply stage, and the instantaneous tracking voltage supply is provided by an error correction stage in dependence on the average tracking voltage supply.

The average tracking voltage may be provided by a filtering means arranged to filter the instantaneous tracking voltage.

In one aspect the invention provides a method of amplifying a signal in a multi-stage amplifier including a first amplifier, comprising tracking the average power of a signal to be amplified, tracking the instantaneous power of a signal to be amplified, and selectively providing a power supply to the amplifier from either the average tracked voltage or the instantaneous tracked voltage.

The method may provide a second amplifier arranged in series to receive at it's input the output of the first amplifier, wherein in a first mode of operation the power supply for the first amplifier is provided by the average tracking voltage supply, and the power supply for the second amplifier is provided by the instantaneous tracking voltage supply, and in a second mode of operation the power supply for the first amplifier is provided by the instantaneous tracking voltage supply and the second amplifier is bypassed.

The method may provide in a third mode of operation the power supply for the first amplifier by the average tracking voltage supply and the second amplifier is bypassed.

The method may provide that the average tracking voltage supply is provided by a switched supply stage, and the instantaneous tracking voltage supply is provided by an error correction stage in dependence on the average tracking voltage supply.

The method may provide that the average tracking voltage is provided by a filtering means arranged to filter the instantaneous tracking voltage.

The method may provide that a second amplifier is arranged in parallel with the first amplifier, the first and second amplifiers having a common input and a common output, wherein in a first mode of operation the first amplifier is selected and the second amplifier is disabled, the power supply to the first amplify being provided by the average tracking voltage supply, and in the second mode of operation the second amplifier is selected and the first amplifier is disabled, the power supply to the second amplified being provided by the instantaneous tracking voltage supply.

The method may provide a third amplifier arranged to provide an input to the first and second amplifiers, wherein in the first or second mode of operation the power supply for the third amplifier is provided by the average tracking voltage supply, and in a third mode of operation the power supply for the third amplifier is provided by the instantaneous tracking voltage supply and the first and second amplifiers are bypassed.

The method may provide that the average tracking voltage supply is provided by a switched supply stage, and the instantaneous tracking voltage supply is provided by an error correction stage in dependence on the average tracking voltage supply.

The method may provide that the average tracking voltage is provided by a filtering means arranged to filter the instantaneous tracking voltage.

The method may provide that a second amplifier is arranged in parallel with the first amplifier, the first and second amplifiers having a common input and a common output, wherein in a first mode of operation the first and second amplifiers are both enabled, the power supply to the first and second amplifiers being provided by the instantaneous tracking voltage supply.

The method may provide that in a second mode of operation one amplifier is enabled and the other amplifier is disabled, the power supply to the selected amplifier being provided by the instantaneous tracking voltage supply.

The method may provide in a second mode of operation one amplifier is enabled and the other amplifier is disabled, the power supply to the selected amplifier being provided by the average tracking voltage supply.

The method may provide that the first and second amplifiers comprise a Doherty configuration.

The method may provide that the average tracking voltage supply is provided by a switched supply stage, and the instantaneous tracking voltage supply is provided by an error correction stage in dependence on the average tracking voltage supply.

The method may provide that the average tracking voltage is provided by a filtering means arranged to filter the instantaneous tracking voltage.

BRIEF DESCRIPTION OF THE FIGURES

The invention will now be described by way of example with reference to the accompanying Figures, in which.

DESCRIPTION OF THE PREFERRED EMBODIMENTS

The invention is described herein with reference to particular embodiments and exemplary arrangements. The invention is not, however, limited to the specifics of such arrangements described. In particular the invention is described in the context of a multi-stage amplifier arrangement comprising a driver amplifier stage and a power amplifier stage, for the amplification of an RF signal. It should be understood by one skilled in the art that the invention is not limited to a multi-stage amplifier arrangement including only two amplifier stages, and the principles of the invention apply to any multi-stage amplifier arrangement including two or more amplifier stages. Further one skilled in the art will appreciate that the principles of the inventive arrangement and the embodiments described herein are not limited to the amplification of RF signals.

The invention is also described herein, in embodiments, in the context of a high efficiency envelope tracking modulated power supply stage for providing a power supply for an amplifier stage, particularly the power amplifier stage. One skilled in the art will appreciate that the invention is not limited to a particular type of efficient modulated power supply stage. A particularly efficient modulated power supply stage is disclosed in European Patent No. 1597821, and the use of such an efficient power supply stage in combination with embodiments of the invention described herein provides a particularly beneficial arrangement. However the invention is not limited to the use of such a specific modulated power supply arrangement, and the principles of the invention and its embodiments as described herein may be utilised in combination with any advantageous tracking or modulated power supply arrangement.

Figure 1:
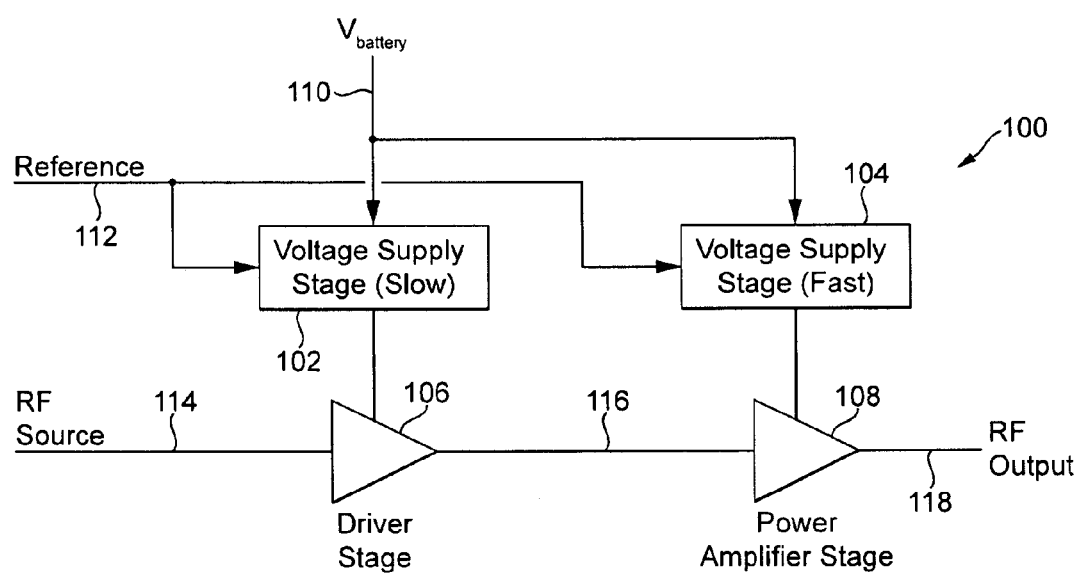
FIG. 1 illustrates the principles of an efficient multi-stage amplifier arrangement in accordance with an inventive arrangement.

With reference to FIG. 1 there is illustrated a multi-stage amplifier arrangement denoted by reference numeral 100, including a first amplifier stage being a driver stage 106, and a second amplifier stage being a power amplifier stage 108. An RF signal to be amplified is received from an RF source on line 114, and provides an input to the driver stage 106. The output of the driver stage 106 is provided on line 116, and forms an input to the power amplifier stage 108. The power amplified RF signal is provided on line 118 at the output of the power amplifier stage 108 as the RF output.

As illustrated in FIG. 1, each of the amplifier stages is associated with a respective voltage supply stage. Thus a voltage supply stage 102 is arranged to provide the supply voltage for the driver stage 106, and a voltage supply stage 104 is arranged to provide the supply voltage for the power amplifier stage 108. Each of the voltage supply stages 102 and 104 receives a battery voltage on a line 110, and a reference signal on a line 112. Each of the voltage supply stages 102 and 104 provide a supply voltage to the respective amplifier stages 106 and 108 in dependence upon the battery voltage and the reference signal.

The voltage supply stage 104 is preferably an envelope tracking modulated power supply stage, which provides fast tracking of the supply voltage delivered to the power amplifier stage 108. The reference signal on line 112 may, for example, be representative of the envelope of the RF signal to be amplified. As such, this reference signal gives an indication as to the instantaneous voltage level which the power amplifier stage 108 must process, and therefore the instantaneous power supply level which should be supplied by the voltage supply stage 104. In a highly efficient, high accuracy tracking (HAT) power supply stage, the voltage supply stage 104 tracks the reference signal in a very close manner, such that the supply voltage provided to the power amplifier stage 108 very closely tracks the reference signal and thus ensures an efficient operation. An efficient operation is ensured by generating the necessary supply voltage to amplify the signal to the desired level, whilst ensuring that the instantaneous supply voltage is not excessively above the desired level.

As mentioned in the background section above, due to timing alignment issues it is not generally possible in prior art arrangements to provide such a fast envelope tracking voltage supply stage for more than one amplifier stage of a multi-stage arrangement, particularly a wideband arrangement. Thus the driver stage 106 is provided with its own voltage supply stage 102, which relative to the voltage supply stage 104 is a slow supply stage. Thus the voltage supply stage 102 does not provide the fast envelope tracking of the voltage supply stage 104. The voltage supply stage 102 can adapt only slowly to changing signal conditions as represented by the reference signal on line 112.

In a practical implementation the voltage supply stage 104 may be implemented as a high accuracy tracking modulated voltage supply such as disclosed in European Patent No. 1597821. Such a voltage supply stage may incorporate a switched supply or voltage selection stage, followed by a modulator stage. The voltage supply stage 102 may be implemented, for example, as a switched supply stage.

In a preferred arrangement, the voltage supply stage 104 may be adapted to track instantaneous power, and deliver an appropriate supply voltage to the power amplifier stage 108; and the voltage supply stage 102 may be adapted to track average power, and deliver an appropriate power supply voltage to the driver stage 106. In general, the voltage supply stage 104 adapts more quickly than the voltage supply stage 102 to changing input signal conditions. The voltage supply stage 102 may be considered a slow stage, and the voltage supply stage 104 may be considered a fast stage.

In a general form, the invention may provide an arrangement in which a relatively slow and/or relatively inefficient first tracking voltage supply stage delivers a supply voltage to a first amplifier stage and a second relatively fast and/or relatively efficient second tracking voltage supply stage delivers a supply voltage to a second amplifier stage. Preferably the first supply stage delivers a power supply voltage in dependence on an average power requirement, and the second supply stage delivers a power supply voltage in dependence on an instantaneous power requirement.

Reference to 'average power' is to the average power of the transmitted signal. Thus average power information may be obtained in a number of ways, examples of which are described herein, as one skilled in the art will appreciate. Averaging is performed over an appropriate time period to determine the average power. Reference to 'instantaneous power' is to the power, at a given time instant, in the transmitted signal. This instantaneous power information may be obtained in a number of ways, as one skilled in the art will appreciate. Indeed this may be obtained by considering the average over a relatively short time period. The average and instantaneous powers may be determined in dependence on the signal to be amplified.

In general herein, the voltage supply stage 102 is considered to provide a power supply voltage in dependence on an average power requirement, and the voltage supply stage 108 is considered to provide a power supply voltage in dependence on an instantaneous power requirement. However it should be understood that the instantaneous power requirement may be determined by looking at the requirement over an average period, but a short average period. In general, therefore, the voltage supplies should be considered relative to each other. The tracking of the stage 102 is slower than that of the stage 104. The voltage generated by the stage 104 is dependent upon a capture of information over a smaller time period than that of stage 102. 'Instantaneous' may be considered as averaged over a relatively short time period.

With reference to FIGS. 2 to 5, there is now discussed four embodiments for implementing a multi-stage amplifier architecture in accordance with the principles of an inventive arrangement as exemplified by FIG. 1.

With reference to FIGS. 2 to 5, it should be noted that any element shown in the figures which correspond to elements shown in previous figures are denoted by similar reference numerals.

Figure 2:
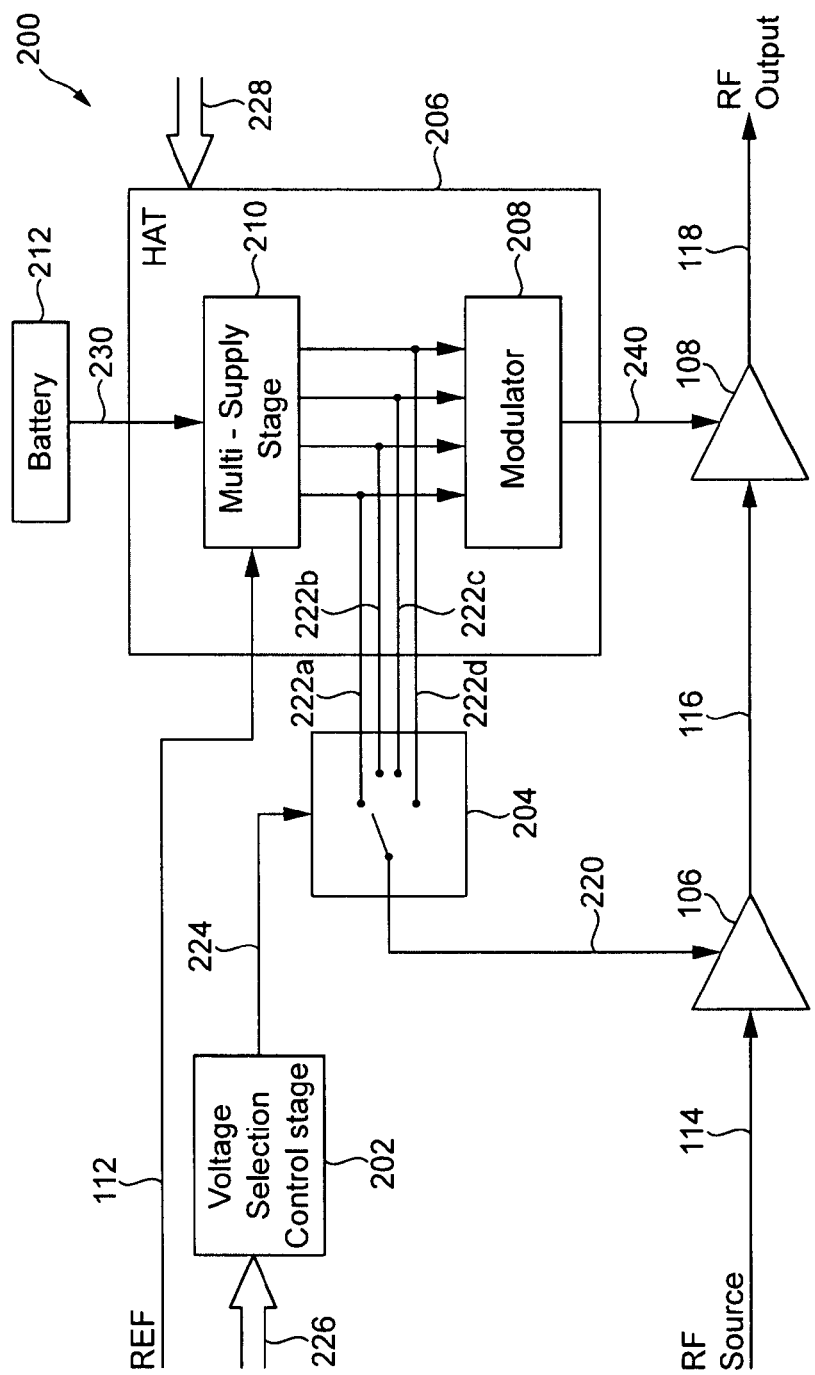
FIG. 2 illustrates an embodiment of the inventive arrangement of FIG. 1.

The multi-stage amplifier arrangement in FIG. 2 is generally denoted by reference numeral 200, and includes the driver stage 106 and the power amplifier stage 108. The voltage supply stage 104 of FIG. 1 is implemented as a high accuracy tracking (HAT) voltage supply stage 206. The voltage supply stage 102 of FIG. 1 is implemented as a voltage selection stage 204 and a voltage selection control stage 202. The HAT voltage supply stage 206 is representative of a fast tracking, modulated voltage supply. The invention is not limited to any specific arrangement of such a supply. In general, in the illustrated embodiment, the HAT voltage supply 206 comprises a multi-supply stage 210, and a modulator 208. The multi-supply stage 210, being a switched supply stage, operates in dependence upon a reference signal, provided on a line 112 (or in general as one of a plurality of control signals 228), to select one of a plurality of fixed supply voltages at its output. The modulator operates as an error correction stage which receives one or more voltages from the multi-supply stage 210, and generates the high-accuracy instantaneous tracking voltage. In general, the switched supply stage provides a supply voltage representative of an average power requirement of a signal to be amplified. In general the modulator, or error correction stage, corrects the switched supply to provide a supply voltage representative of an instantaneous power requirement of the signal to be amplified.

The control signals 228 may further include, for example, configuration and clock information.

The fixed supply voltages are generated from a battery voltage provided by a battery 212 on line 230. The battery voltage on line 230 forms an input to the multi-supply stage 210. In the illustrated example, the multi-supply stage 210 provides four fixed output voltage levels. The four fixed output voltages are provided on separate lines to the modulator 208. The modulator 208 acts on one of the selected supply voltages, in dependence on the reference signal on line 112, to provide a fast envelope tracking of the reference signal, to deliver an efficient supply voltage on line 240 to the power amplifier 108. The operation of such an efficient modulated power supply stage will be well-known to one skilled in the art.

In this embodiment, the voltage selection stage 204 receives each of the voltage levels output by the multi-supply stage 210, on respective lines 222a to 222d. The voltage selection stage 204 selects one of the voltage levels on lines 222a to 222d to provide the voltage level on line 220 for the supply voltage for the driver stage 106. The selection is made in dependence upon a control or selection signal provided on line 224, which control signal is generated by the voltage selection control stage 202. The voltage selection control stage 202 generates the control signal on line 224 in dependence upon control signals received on lines 226.

The voltage selected from the multi-supply stage 210 for each of the modulator 208 and the switcher 204 may be different.

The control signals on lines 226 preferably include the uplink transmit power, which is determined by the network, to control the supply voltage selected in the voltage selection stage 204.

The voltage selection control stage 202 may be implemented as a look-up table. The look-up table may be arranged to store a mapping from a power control level—such as of the uplink transmit power—to a driver supply voltage. The table values may be chosen during the design and development phase. Alternatively the table values may be set-up during a calibration process.

As discussed above, the power supply stage 206 provides instantaneous tracking of a reference signal to provide an efficient instantaneous power supply voltage for the power amplifier stage 108. The voltage selection stage 204, in combination with a voltage selection control stage 202, provides an approximate power supply voltage, by selecting one of a plurality of available fixed supply voltages.

The available switched supply voltages are selected by the voltage selection control stage 202 to ensure that the driver stage can provide sufficient peak RF drive power for the output stage. In a time division system, where time slots are used, such as a mobile communication system, this may be updated on a time slot-by-time slot basis. For each time slot, an appropriate fixed voltage level is chosen. The RF power head room in the driver stage can then be carefully controlled so it operates with the best possible efficiency, given the non-modulated power control level dependent supply.

In mobile telecommunication systems, a handset or in general a mobile device has a power control level (PCL) set, which determines the transmit power of the device. This PCL may be set by the network.

The network may tell the handset which PCL should be used in a given timeslot. This information may be conveyed by the network issuing a specific PCL to the handset. In an alternative, such as in 3G WCDMA networks, the network may issue commands to the handset rather than values, e.g. commands for the power level to be increased, decreased, or remain the same. This information or command may be included in the control signals on lines 226.

The supply voltage levels associated with PCL levels in the look-up table are determined taking into account appropriate factors. A PCL typically represents the average power in a timeslot (ignoring any ramping at the start and end of the time slot). In some applications, the average and peak power may be the same, whilst in others the peak power will be higher than the average. As the power supply selected needs to be sufficient for handling peak powers, the look-up table is arranged to select appropriate power levels in dependence upon a PCL level, taking into account these factors.

In a preferred arrangement, a clean-up block is provided on line 220, preferably with regulation, for cleaning up the supply signal before delivery to the amplifier.

Figure 3:
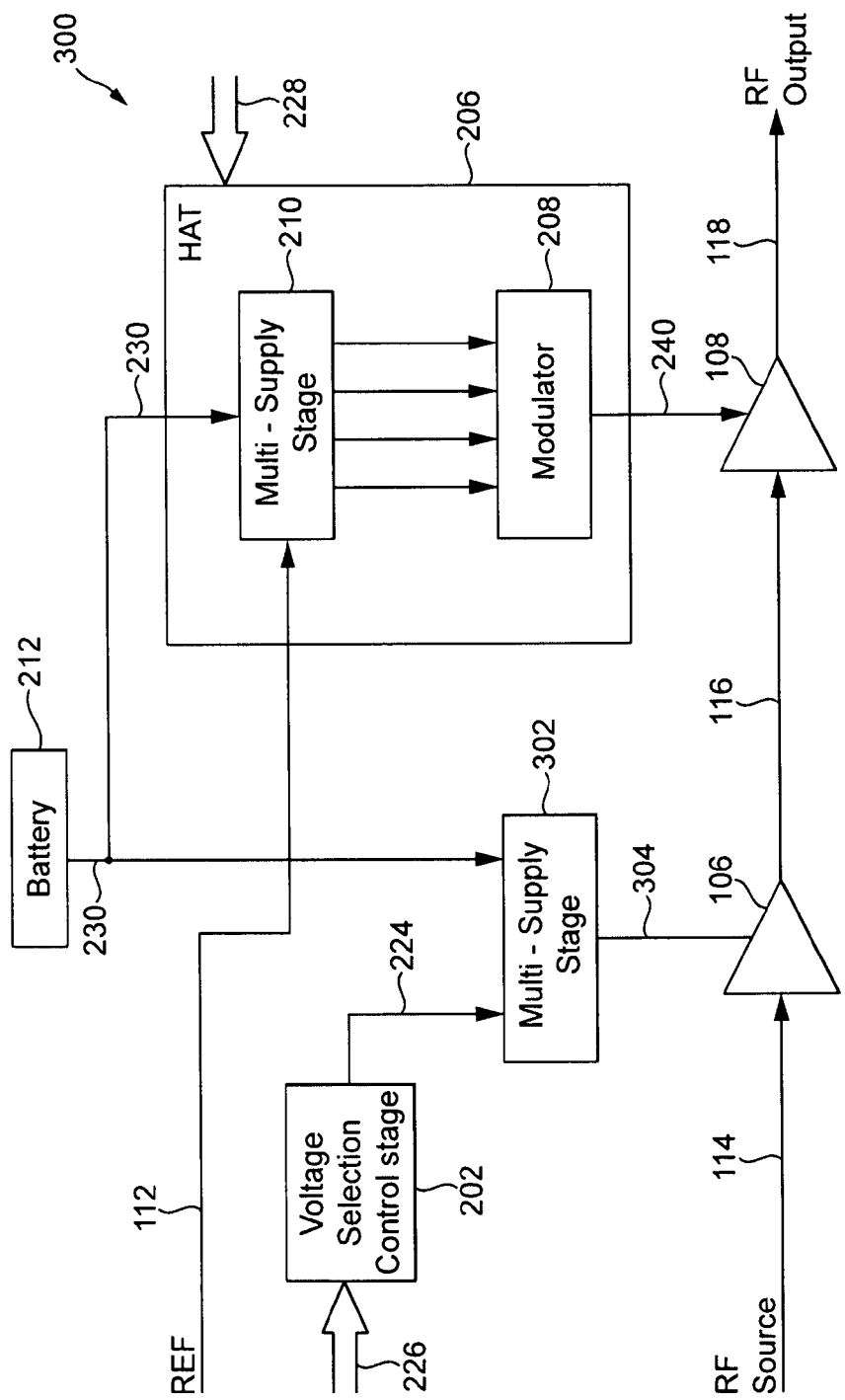
FIG. 3 illustrates a second embodiment of the inventive arrangement of FIG. 1.

With reference to FIG. 3, there is illustrated a second embodiment in accordance with an inventive arrangement. The multi-stage amplifier arrangement of FIG. 3 is generally denoted by reference numeral 300, and corresponds to that of FIG. 2 but the voltage selection stage 204 of FIG. 2 is replaced by a multi-supply stage 302. The multi-supply stage 302 is an exemplary implementation of the slow supply stage 102 of FIG. 1.

The multi-supply stage 302 receives the voltage signal on line 230 from the battery 212, and in addition receives the control or selection signal on line 224 from the voltage selection control stage 202. The output of the multi-supply stage 302 is provided on line 304, and provides a supply voltage for the driver stage 106.

The arrangement of FIG. 3 differs to that of FIG. 2, insofar as the power supply stage for the driver stage is provided with its own multi-supply stage 302. Thus the voltage supply on line 304 provided by the multi-supply stage is one of a multiple of available fixed supply voltages, generated from the battery voltage on line 230, and selected in dependence on the control or selection signal on line 224.

A third embodiment of a multi-supply stage arrangement in accordance with the inventive arrangement of FIG. 1 is illustrated with reference to FIG. 4, and denoted by reference numeral 400. The arrangement of FIG. 4 corresponds to that of FIG. 3, but the multi-supply stage 302 is adapted to receive a reference signal on line 410 which is derived from the output of the HAT 206. Thus the voltage selection control stage 202 of FIG. 3 is dispensed with, and a reference signal on line 410 is used to control the voltage of the multi-supply stage 302 to be provided as a supply voltage on line 304. The multi-supply stage can provide one of a set of fixed voltage levels as the supply voltage on line 304, or provide a continuously varying supply voltage.

A low pass filter (LPF) denoted by reference numeral 402 receives the modulated supply voltage on line 240 delivered to the power amplifier stage, and provides a filtered version of such on line 410 as the reference signal. The low pass filter 402 thus provides on line 410 a signal corresponding to the average of the modulated power supply voltage generated on line 240.

Figure 4:
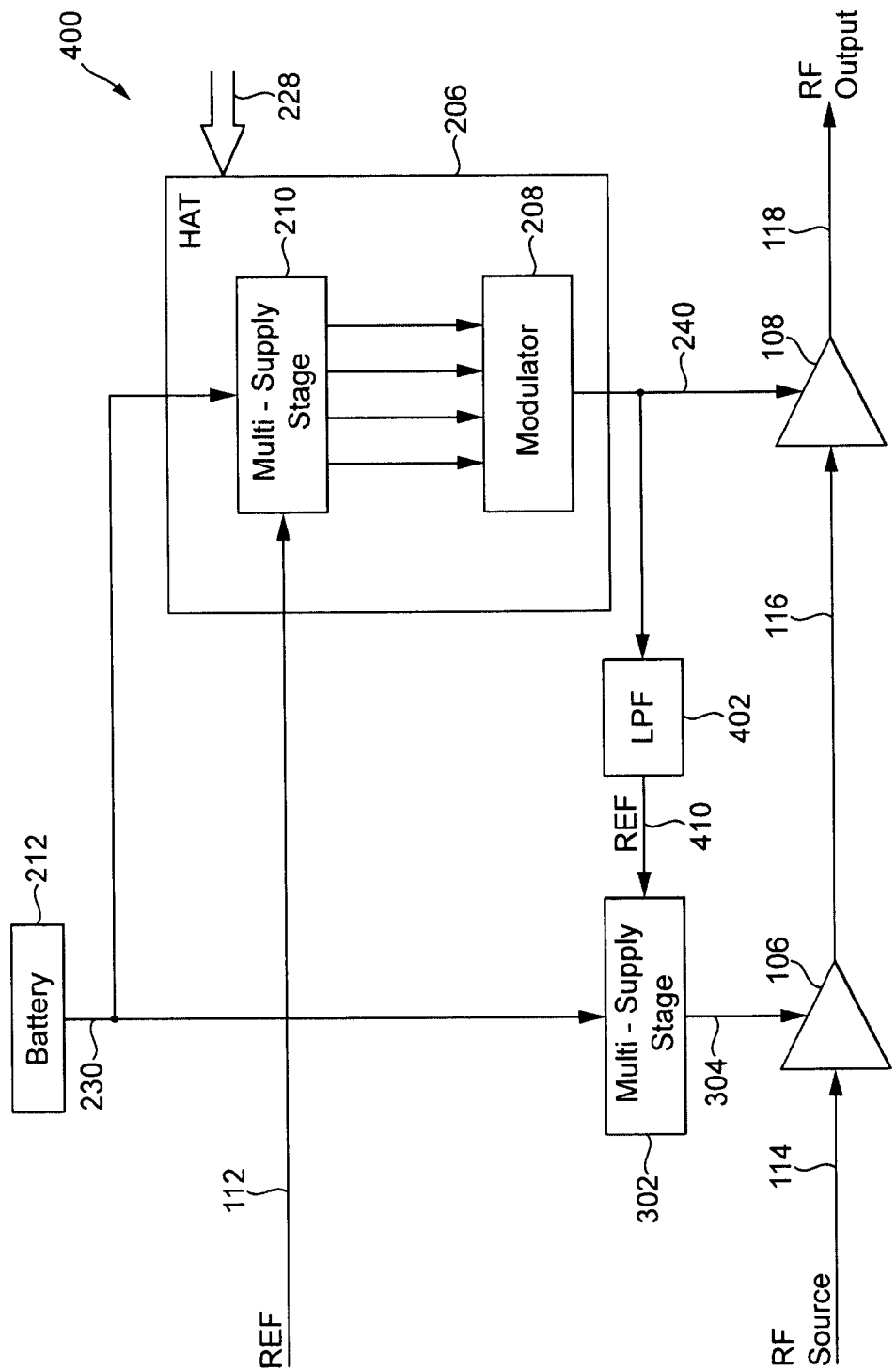
FIG. 4 illustrates a third embodiment of the inventive arrangement of FIG. 1.

The arrangement of FIG. 4 is advantageous in avoiding the need for the voltage selection control stage 202 which provides an interface for the PCL. Thus the hardware and software complexity of the multi-stage amplifier arrangement is reduced. The arrangement allows the voltage supply generation for each stage of the multi-stage amplifier arrangement to be self-contained.

The arrangement of FIG. 4 generates the voltage supply in dependence on an average power requirement, by deriving the average power requirement from the voltage supply generated in dependence on the instantaneous power requirement. Thus the voltage supply is generated by determining the average of the instantaneous voltage supply.

A further modification may be made to the arrangement of FIG. 4, and any arrangement in which the supply voltage to the driver stage is derived directly from the supply voltage to the output amplifier stage. There may be a requirement for the voltage applied to the driver amplifier stage to be further adjusted in dependence on the peak-to-average (PAR) of the transmitted RF signal. For this purpose a scaling means (not shown) may be provided before or after the low pass filter 402. If the transmitter is required to handle a variety of transmission formats, with varying PAR values, then PAR-dependent scaling may be appropriate. With reference to FIG. 4, the scaling means would preferably be placed somewhere along the path between the output amplifier stage voltage supply output and the input to the driver amplifier stage voltage supply stage. In the arrangement of FIG. 4 this requires the scaling means to be placed before or after (i.e. at the input or output of) the low pass filter 402.

Figure 5:
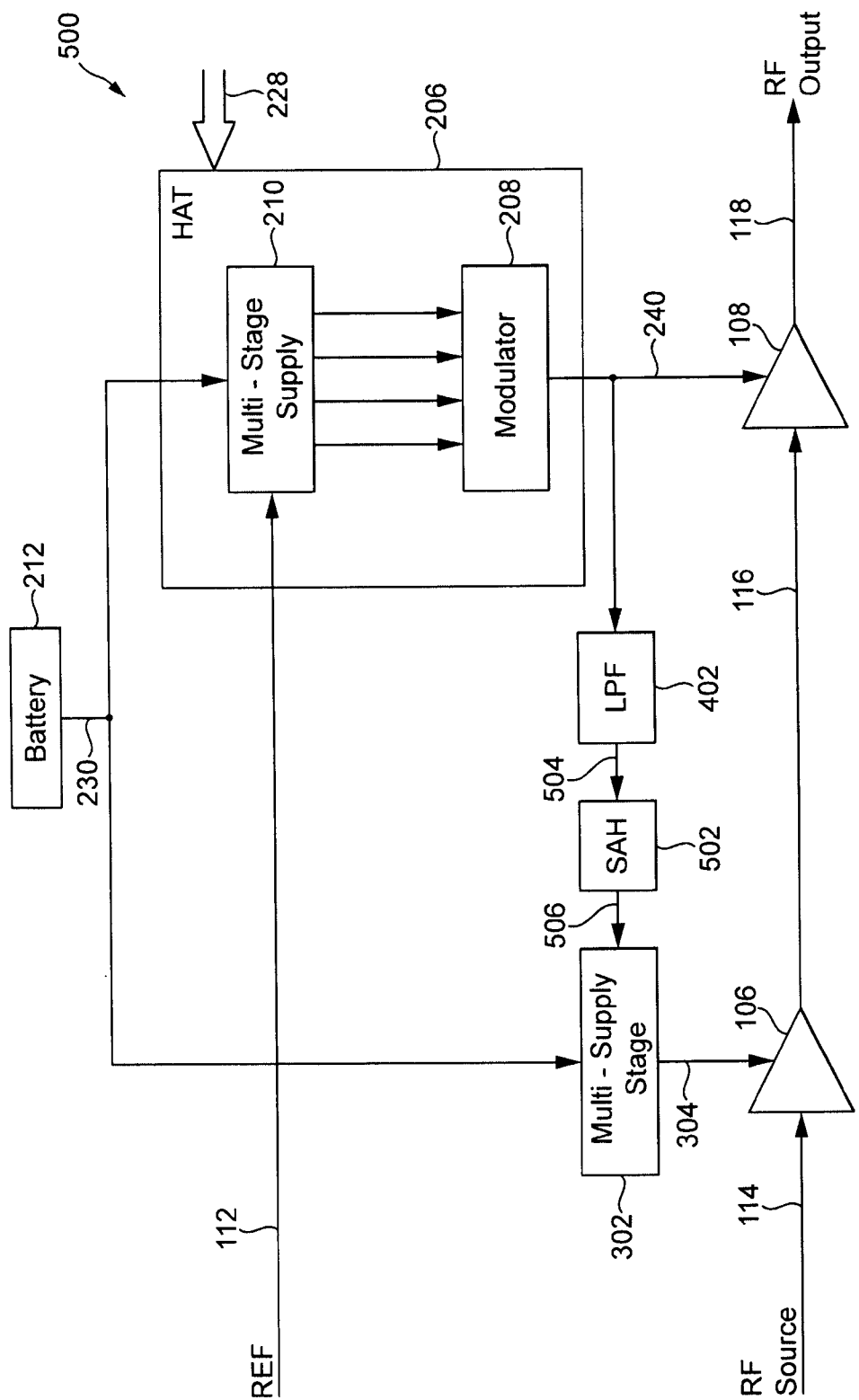
FIG. 5 illustrates a fourth embodiment of the inventive arrangement of FIG. 1.

With reference to FIG. 5, there is further illustrated a fourth embodiment for implementing the multi-amplifier arrangement in accordance with the inventive arrangement of FIG. 1. In FIG. 5, the multi-stage amplifier arrangement is generally denoted by reference numeral 500.

The embodiment of FIG. 5 generally corresponds to that of FIG. 4, with the addition of a sample-and-hold (SAH) block between the low pass filter 402 and the multi-supply stage 302. The output of the low pass filter 402 on a line 504 forms an input to the SAH block 502, and in the output of the SAH block on line 506 forms the input to the multi-supply stage 302, being the reference signal for selection of the appropriate fixed supply voltage.

The sample-and-hold block ensures that the power supply stage for the driver amplifier is provided with a reference signal, on line 506, which remains constant across a given time slot or other given time period. The sample-and-hold block 502 may be triggered at a time slot boundary. This ensures that the supply voltage on line 304 for the driver stage remains constant for a given time slot.

The inventive arrangement is not limited to the specifics of any of the four embodiments described hereinabove. For example, the invention is not limited to the implementation of the power amplifier stage 108 as a single amplifier stage. The power amplifier stage 108 may be implemented as a plurality of parallel amplifier stages. The plurality of amplifier stages may be identical, being provided for ensuring an appropriate power level can be generated at the output thereof. Alternatively ones of the parallel power amplifier stages may be associated with different frequencies, such that the output amplifier stage can switch between ones of the parallel power amplifiers according to the frequency of the signal to be amplified.

A further inventive arrangement, which may be used in combination with or independently of the arrangements shown in each of FIGS. 1 to 5, is now illustrated with reference to FIGS. 6 and 7. In some power amplifier arrangements, it is known to provide a bypass arrangement which allows the power amplifier to be bypassed when high powers are not required. Thus when a high powered signal is required to be generated, the signal is amplified by the output power amplifier, and when a low or medium power signal is required, the power amplifier is bypassed and not used. In a multi-stage amplifier arrangement, when the power amplifier is bypassed the signal may be amplified by only the driver stage.

When the output power amplifier is bypassed and therefore effectively disabled, the power supply generation for the power amplifier stage is not needed. Thus any control provided for the generation of an efficient tracking power supply for the output amplifier is no longer required.

In accordance with this further inventive arrangement, the efficiencies achieved by the provision of a fast, modulated power supply stage are preferably utilised when the amplifier stage for which it is provided is disabled or bypassed.

In the foregoing, there has been described various techniques in which an average tracking power supply may be generated for providing a power supply to a first amplifier stage, such as amplifier 106. Other arrangements may be used. For example, the average tracking power supply may be derived by filtering the output of the modulator 208, and providing the filtered signal as the supply voltage to the amplifier 106.

Figure 6:
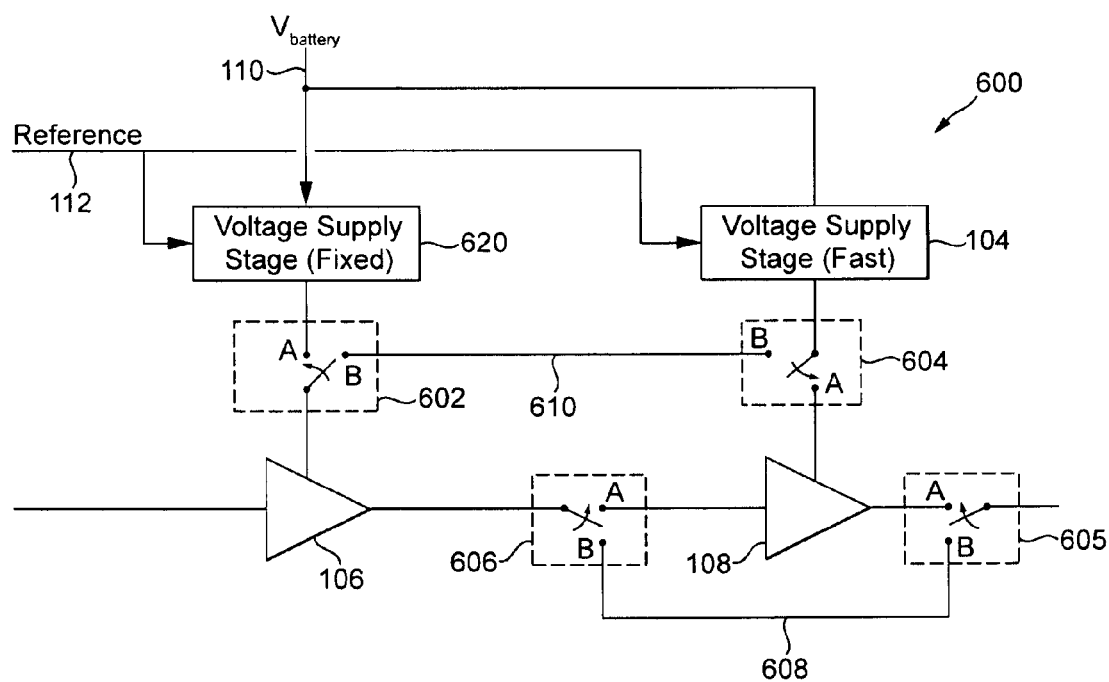
FIG. 6 illustrates the principles of an efficient multi-stage amplifier arrangement in accordance with an inventive arrangement.

With reference to FIG. 6, there is illustrated a multi-stage amplifier arrangement 600 similar to that of FIG. 1. The arrangement of FIG. 6 differs to that of FIG. 1 in that the voltage supply stage for the driver amplifier stage 106 is provided as a fixed voltage supply rather than a slowly varying (e.g. switched) voltage supply. In addition four switches identified by reference numeral 602, 604, 606 and 605 are provided.

The multi-stage amplifier arrangement 600 of FIG. 6 is implemented with a fixed voltage supply stage 620 for the driver amplifier stage for purposes of illustration. The principles discussed hereinabove with reference to each of FIGS. 1 to 5 are not essential to the inventive arrangement of FIG. 6. In an alternative, the fixed voltage supply stage 620 of FIG. 6 may be implemented as a slow (or inefficient) voltage supply stage such as supply stage 102 of FIG. 1. However, as illustrated, the voltage supply stage 620 may be a switched supply, being switched in dependence on the reference signal on line 112.

The inventive arrangement described with reference to FIG. 6 takes advantage of the fact that the fast or efficient voltage supply stage 104 is not used when the output amplifier 108 is bypassed. Therefore the arrangement is adapted such that when the output amplifier is bypassed, the fast, efficient voltage supply stage 104 is arranged to provide the voltage supply to the driver stage 106. This is achieved by the operation of the switches 602, 604, 605 and 606.

It should be noted that in FIG. 6 the control signals necessary to control the switches are not illustrated. One skilled in the art will appreciate that such control signals are generated in order to enable the bypassing of the output amplifier 108 in accordance with prior art techniques. These control signals are then extended to be further used in order to enable the inventive principles.

As illustrated in FIG. 6, each of the switches 602, 604, 605 and 606 is switchable between two positions A and B. In the first mode of operation, when the output amplifier 108 is not bypassed, each switch is connected to switch position A. In such an arrangement, the fast, efficient voltage supply stage 104 provides the supply voltage for the output amplifier 108, and the fixed voltage supply stage 620 provides the voltage supply for the driver stage 106. The output of the driver stage 106 is amplified by the output amplifier 108 and the amplified output provided at its output.

It will be understood by one skilled in the art that the arrangement of FIG. 6 is exemplary. The switching between modes may be achieved in different ways than those illustrated. For example, the switch 604 may be dispensed with and the supply voltage from supply 104 connected to terminals A and B simultaneously. An alternative switch may then be provided to bias the amplifier 108 'off' in bypass mode.

In a second mode of operation, the output amplifier 108 is bypassed. The decision to bypass the output amplifier is taken by control circuitry which is not described herein. The bypassing of output amplifiers in certain conditions is known in the art, and one skilled in the art will appreciate the implementation of such control. In response to a control signal to bypass the output amplifier, each of the switches 602, 604, 605 and 606 are switched to positions B. Thus the output of the driver amplifier 106 provides the output of the amplification stage 600, by virtue of bypass switches 605 and 606 being switched to positions B.

In addition, the voltage supply input to the driver stage 106 is disconnected from the fixed voltage supply stage 620, by switching of the switch 602 to position B. The output of the voltage supply stage 104 is switched to switch position B of switch 604, such that the output of the voltage supply stage 104 provides the supply voltage to the driver stage 106. Thus when the output amplifier 108 is bypassed, the fast, efficient voltage supply stage 104 provides the voltage for the driver stage 106, which operates in a highly efficient manner.

Whilst the principles of this inventive arrangement are not limited to the specifics of any of the embodiments described with reference to FIGS. 1 to 5, one skilled in the art will appreciate that the principles may nevertheless be extended to, and incorporated in, each of the embodiments of FIGS. 1 to 5. In order to illustrate this, FIG. 7 shows the principles of the inventive arrangement of FIG. 6 implemented in the embodiment of FIG. 5 described hereinabove.

Figure 7:
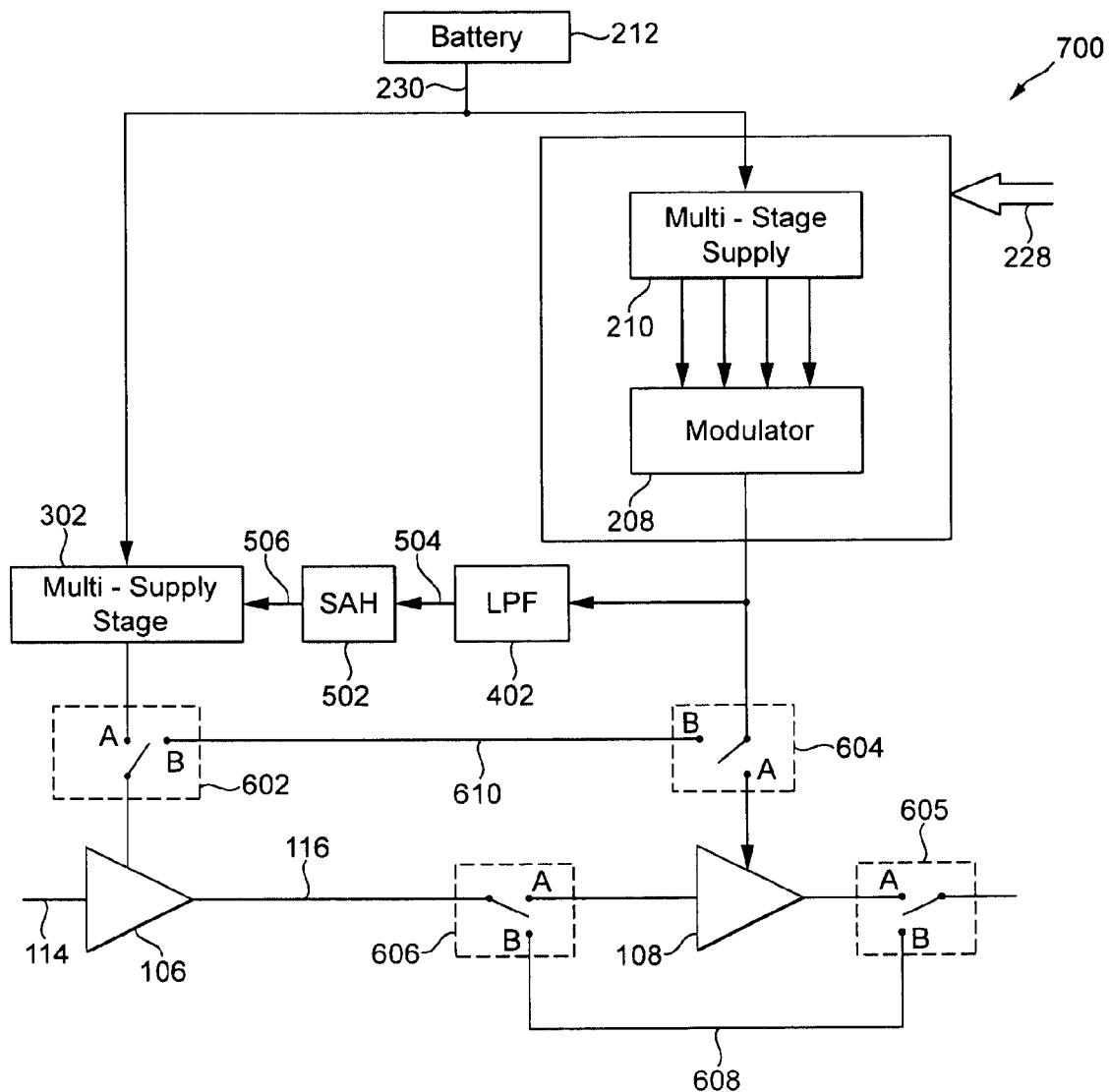
FIG. 7 illustrates an embodiment of the inventive arrangement of FIG. 6.

With reference to FIG. 7, the arrangement of FIG. 5 is adapted to include the plurality of switches 602, 604, 605 and 606, in a multi-stage amplifier arrangement denoted by reference numeral 700.

As described hereinabove with reference to FIG. 6, in a first mode of operation the output amplifier 108 is enabled for amplifying the output of the driver stage 106. Thus each of the switches 602, 604, 605 and 606 has its switch connected to terminal A, and the arrangement of FIG. 7 then corresponds identically to that of FIG. 5 hereinabove.

In the second mode of operation, when a control signal indicates that the output amplifier 108 should be bypassed, each of the switches 602, 604, 605 and 606 is controlled to connect to terminal B. In this way, and as described hereinabove with reference to FIG. 6, the output amplifier 106 is bypassed, and the output of the driver stage provides the output of the multi-stage amplifier 700. In addition, the output of the fast, modulated supply stage 206 provides the voltage supply for the driver stage 106 via switches 604 and 602, such that the driver stage 106 operates in a highly efficient manner.

Figure 8:
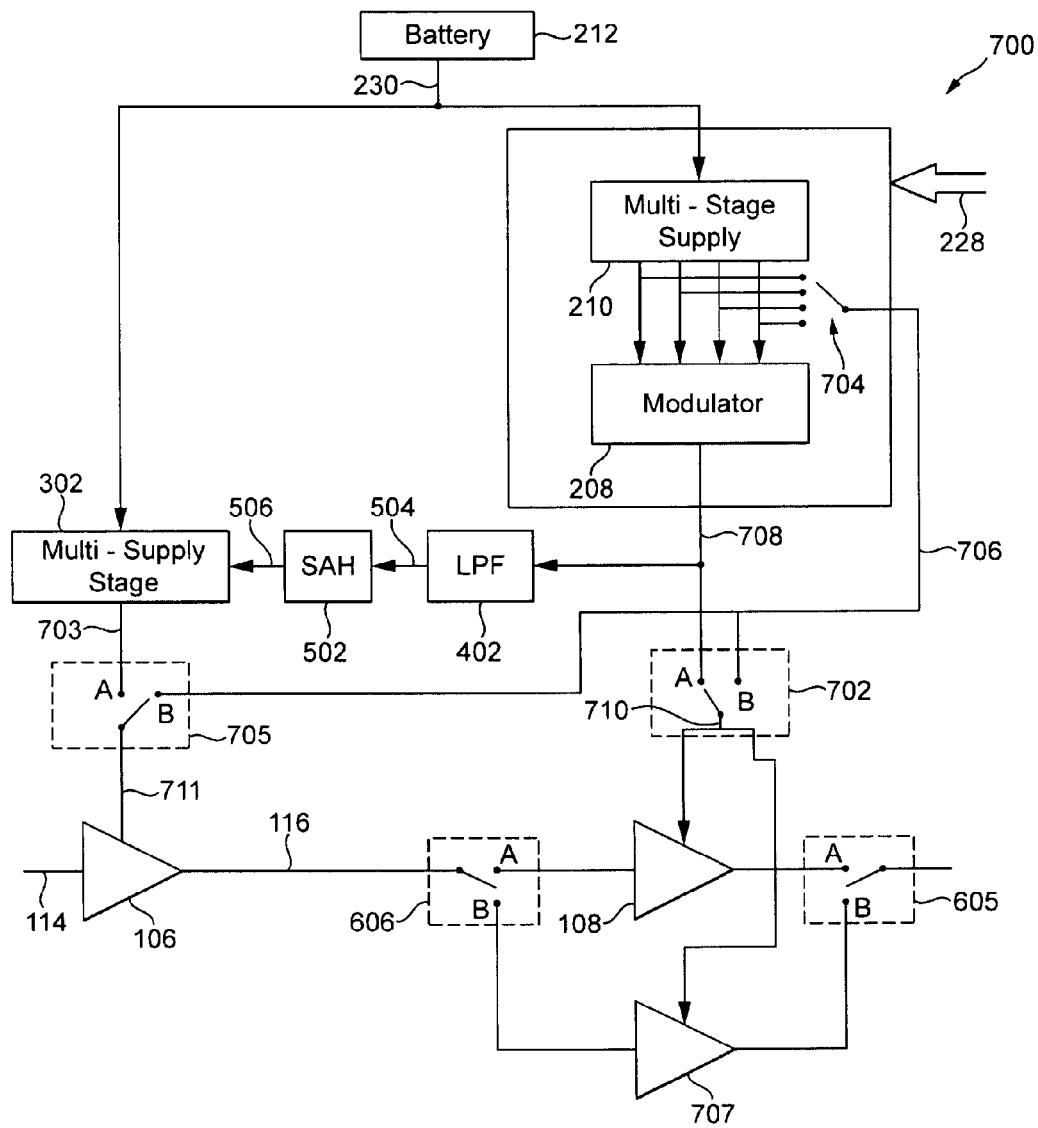
FIG. 8 illustrates a further embodiment of the invention.

With reference to FIG. 8, a further example arrangement in accordance with one or more inventive or preferable arrangements is described. These arrangements are described in accordance with the principles of FIGS. 6 and 7. In particular the arrangement of FIG. 8 is presented as a modification to the arrangement of FIG. 7. It is not, however, limited to the specifics of the arrangement of FIG. 7.

However none of the specific features shown in FIG. 8 or described in the context of FIG. 8 are limited to being dependent upon any particular combination of features with which they are described or which are described elsewhere in this description. Any individual feature described herein may be implemented on its own or in combination with one or more described features.

With reference to the example arrangement of FIG. 8, the multi-supply stage 302 of FIG. 7 is illustrated as providing a supply voltage for the amplifier 106 via a switch 705. This is for ease of illustration only. Alternatively a supply voltage may be supplied to the amplifier 106 from the switched supply output of the multi-stage supply 210, also via switch 705, on line 706. A switch 704 is provided to select one of the supply voltages at the output of the multi-stage supply 210, and provide that on a line 706. In such an arrangement a clean-up block, preferably with regulation, may be provided on line 706.

The provision of the supply voltage may be provided to the amplifier 106 in accordance with any technique described herein. Both options illustrated in FIG. 8 deliver a tracked average supply voltage to the amplifier 106. An alternative averaged supply voltage may be provided by filtering the instantaneous tracked voltage on line 708 and providing that as the supply voltage for the amplifier 106.

In addition, in certain modes of operation, and in particular where the output amplifier stage is bypassed, the instantaneous tracked supply voltage may be provided to the supply terminal of the amplifier 106.

The tracked instantaneous supply voltage from the modulator 208 is provided on line 708, A switch 702 is provided to select between the signals on lines 706 and 708, and connect one to a supply line 710. The supply line 720 connects the selected supply to the supply terminals of two amplifiers: the amplifier 108 and an amplifier 707.

The amplifiers 108 and 707 are preferably—in one arrangement—for amplifying different magnitudes or ranges of signals. In such an exemplary arrangement the circuit is controlled such that one amplifier is connected to amplify signals at any one time. In dependence upon which amplifier is enabled, either the average (slow) supply voltage on line 706 or the instantaneous (fast) supply voltage on line 708 is provided.

Thus, for example, in the event that the amplifier 108 is needed to amplify the signals, in an arrangement all switches 605, 606 and 702 are switched to positions A. In the event that the amplifier 708 is needed to amplify the signals, all switches 605, 606 and 702 are switched to positions B.

Alternative arrangements are envisaged. In the example above, the amplifier 106 receives a tracked average supply voltage. In general, the amplifier 106 may receive a tracked average supply voltage in a number of different ways, from different sources. In such arrangements the supply voltage to the amplifier 106 may be switched so as it may be connected to more than one source, or may be fixed to one source.

In a mode of operation in which a subsequent amplifier stage is bypassed, the amplifier 106 may receive a tracked instantaneous supply voltage. In such arrangements the supply voltage to the amplifier 106 may be switched so as it may be connected to more the source of either the average or instantaneous tracked supply.

The amplifier stage, as represented by amplifiers 108 and 707 in FIG. 8, may in general comprise n amplifiers. The amplifiers may be arranged such that any one of the n amplifiers may be selected or a sub-set of the n amplifiers may be selected. When a plurality of amplifiers are selected, each of the selected amplifiers is connected to the same supply voltage. The supply voltage may be a tracked instantaneous supply voltage or a tracked average supply voltage. The source of tracked instantaneous supply voltage or the tracked average supply voltage may be any source described in this description.

In an arrangement where more than one parallel amplifier, such as amplifiers 108 and 707, are selected or enabled at the same time, such an arrangement may be a Doherty arrangement. However two or more parallel amplifiers may be selected or enabled at the same time in a non-Doherty configuration.

Each of the amplifiers 108 and 707 may be enabled/disabled or selected as described herein, with either the amplifier 108 or amplifier 707 comprising an amplifier stage consisting of a plurality of amplifiers, which respective plurality of amplifiers comprise a set which are enabled/disabled together.

Various other modifications are possible.

In general a power amplifier stage may have two or more amplifiers connected in parallel. In one operating mode, typically at high power RF, an envelope tracking scheme is preferably used to deliver a supply voltage to the power amplifier stage. In another mode, the power amplifier stage preferably receives a power-level dependent supply.

Whilst in one mode of operation two or more stages of the parallel power amplifier stage are used for amplifying different magnitudes ranges of signals, and only one is enabled at a time, in alternative arrangements, such as a Doherty arrangement or similar arrangement operating at high power, for example, two or more amplifiers may operate simultaneously.

Where an amplifier is disabled or 'switched off' in any mode of operation, this may be achieved by any suitable mechanism. For example a disabled amplifier may be biased 'off' of switched out of the circuit. The power supply to a disabled amplifier may be switched off, and thus each individual amplifier may have an individual switch for switching to a supply voltage, to allow such switching to take place.

It should be understood that various aspects of each of the inventive arrangements and embodiments described herein may be implemented in isolation or in combination. Thus a feature disclosed in any embodiment herein may be combined with a feature of another embodiment. Features illustrated in one embodiment are not essential for the implementation of other features in other embodiments.

The invention has been described herein by way of particular embodiments, which are useful for understanding the invention and its preferred implementations. The invention is not, however, limited to the specifics of any implementation. The scope of the invention is defined in the appended claims.

What is claimed is:

1. A multi-stage amplifier comprising: a first amplifier stage; a second amplifier stage; a first voltage supply stage arranged to provide a supply voltage to the first amplifier in dependence on an average power of a signal to be amplified; and a second voltage supply stage arranged to provide a supply voltage to the second amplifier in dependence on an instantaneous power of a signal to be amplified, wherein the first voltage supply stage comprises a switched supply stage, and wherein the switched supply stage selects one of a plurality of supply voltages generated in the second voltage supply stage.

2. The multi-stage amplifier of claim 1 wherein the switched supply stage selects one of a plurality of supply voltages generated in the first voltage supply stage.

3. The multi-stage amplifier of claim 1 further comprising means for determining the instantaneous power and the average power, wherein the average power is determined over a predetermined time interval.

4. A multi-stage amplifier comprising: a first amplifier stage; a second amplifier stage; a first voltage supply stage arranged to provide a supply voltage to the first amplifier in dependence on an average power of a signal to be amplified; and a second voltage supply stage arranged to provide a supply voltage to the second amplifier in dependence on an instantaneous power of a signal to be amplified, wherein there is provided a means for determining the average of the supply generated by the second supply voltage stage, and providing the first supply voltage in dependence upon the determined average.

5. The multi-stage amplifier of claim 4 wherein the means for determining the average of the supply generated by the second supply voltage stage comprises a low pass filter.

6. The multi-stage amplifier of claim 4 wherein the first voltage supply stage further comprises a switched supply stage, wherein the switched supply is controlled by the determined average.

7. The multi-stage amplifier of claim 4, further comprising a sample-and-hold stage for sampling the determined average.

8. A multi-stage amplifier comprising: a first amplifier stage; a second amplifier stage; a first voltage supply stage arranged to provide a supply voltage to the first amplifier in dependence on an average power of a signal to be amplified; and a second voltage supply stage arranged to provide a supply voltage to the second amplifier in dependence on an instantaneous power of a signal to be amplified, wherein the first and second voltage supply stages are arranged to selectively provide supply voltages to the first and second amplifier stages, wherein in a first mode of operation a signal is amplified by the first and second amplifier stages, and the first supply voltage stage is selected to provide a supply voltage to the first amplifier stage and the second supply voltage stage is selected to provide a supply voltage to the second amplifier stage, and in a second mode of operation the second amplifier is bypassed, the signal being amplified by the first amplifier stage, and the second supply voltage stage being selected to provide a supply voltage to the first amplifier stage.

9. A method of amplifying a signal in an amplification stage comprising a first amplifier stage; a second amplifier stage; a first voltage supply stage; and a second voltage supply stage, the method comprising: arranging the first voltage supply stage to provide a supply voltage to the first amplifier in dependence on an average power of a signal to be amplified; and arranging the second voltage supply stage to provide a supply voltage to the second amplifier in dependence on an instantaneous power of the signal to be amplified, wherein the first voltage supply stage comprises a switched supply stage, and wherein the switched supply stage selects one of a plurality of supply voltages generated in the second voltage supply stage.

10. The method of claim 9 wherein the switched supply stage selects one of a plurality of supply voltages generated in the first voltage supply stage.

11. A multi-stage amplifier comprising: a first amplifier stage; a second amplifier stage; a first tracking power supply stage for providing a tracking supply voltage to the first amplifier; and a second tracking power supply stage, for providing a tracking supply voltage to the second amplifier, wherein the second tracking power supply voltage tracks faster than the first, further comprising determining the average of the supply generated by the second supply voltage stage, and providing the first supply voltage in dependence upon the determined average.

12. The method of claim 11 wherein the step of determining the average of the supply generated by the second supply voltage stage comprises low pass filtering.

13. The method of claim 11 wherein the first voltage supply stage further comprises a switched supply stage, wherein the method further comprises controlling the switched supply by the determined average.

14. The method of claim 11, further comprising a sampling the determined average.

15. A method of amplifying a signal in an amplification stage comprising a first amplifier stage; a second amplifier stage; a first voltage supply stage; and a second voltage supply stage, the method comprising: arranging the first voltage supply stage to provide a supply voltage to the first amplifier in dependence on an average power of a signal to be amplified; and arranging the second voltage supply stage to provide a supply voltage to the second amplifier in dependence on an instantaneous power of the signal to be amplified, wherein the first and second voltage supply stages selectively provide supply voltages to the first and second amplifier stages, wherein in a first mode of operation a signal is amplified by the first and second amplifier stages, and the first supply voltage stage is selected to provide a supply voltage to the first amplifier stage and the second supply voltage stage is selected to provide a supply voltage to the second amplifier stage, and in a second mode of operation the second amplifier is bypassed, the signal being amplified by the first amplifier stage, and the second supply voltage stage being selected to provide a supply voltage to the first amplifier stage.

* * * * *

UNITED STATES PATENT AND TRADEMARK OFFICE
CERTIFICATE OF CORRECTION

PATENT NO. : 8,659,355 B2  Page 1 of 1
APPLICATION NO. : 13/129718
DATED : February 25, 2014
INVENTOR(S) : Henshaw et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 230 days.

Signed and Sealed this

Twenty-ninth Day of September, 2015

Michelle K. Lee
*Director of the United States Patent and Trademark Office*